(12) United States Patent
Lin et al.

(10) Patent No.: US 6,190,981 B1
(45) Date of Patent: Feb. 20, 2001

(54) METHOD FOR FABRICATING METAL OXIDE SEMICONDUCTOR

(75) Inventors: Tony Lin, Kaohsiung Hsien; Jih-Wen Chou, Hsinchu, both of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/243,740

(22) Filed: Feb. 3, 1999

(51) Int. Cl.$^7$ ............................................... H01L 21/336
(52) U.S. Cl. .................... 438/305; 438/303; 438/307; 438/306; 438/291; 438/290
(58) Field of Search ........................... 438/305, 174, 438/181, 184, 185, 217, 231, 232, 307, 306, 291, 303, 301, 290

(56) References Cited

U.S. PATENT DOCUMENTS

| | | | |
|---|---|---|---|
| 5,736,446 | * 4/1998 | Wu ........................................... | 438/305 |
| 5,759,901 | * 6/1998 | Loh et al. .................................. | 438/305 |
| 5,908,313 | * 6/1999 | Chau et al. ................................. | 438/299 |
| 5,914,519 | * 6/1999 | Chou et al. ................................. | 257/410 |
| 5,972,762 | * 10/1999 | Wu ........................................... | 438/305 |
| 5,972,763 | * 10/1999 | Chou et al. ................................. | 438/305 |
| 5,994,747 | * 11/1999 | Wu ........................................... | 257/408 |
| 5,998,284 | * 12/1999 | Azuma ....................................... | 438/514 |
| 6,015,746 | * 1/2000 | Yeh et al. ................................... | 438/421 |
| 6,046,472 | * 4/2000 | Ahmad et al. ............................. | 257/336 |
| 6,049,114 | * 4/2000 | Maiti et al. ................................ | 257/412 |
| 6,064,107 | * 5/2000 | Yeh et al. ................................... | 257/522 |

* cited by examiner

Primary Examiner—Mary Wilczewski
Assistant Examiner—James Park

(57) ABSTRACT

A method of for fabrication a metal oxide semiconductor transistor is described. A substrate with an isolation structure thereon is provided. A gate oxide layer is formed on the substrate. A polysilicon layer is formed on the gate oxide layer. The polysilicon layer is patterned to form a gate on the gate oxide layer. An offset spacer is formed on the sidewall of the gate. A source/drain extension is formed in the substrate on two sides of the gate by ion implantation. An insulating spacer is formed on the sidewall of the offset spacer. A source/drain region is formed in the substrate by ion implantation using the gate, the offset spacer and the insulating spacer as a mask. Salicide is formed on the gate and on the surface of the source/drain region. After forming the salicide, the offset spacer is removed. After removing the offset spacer, a halo doped region is formed in the substrate below the source/drain extension by ion implantation.

18 Claims, 3 Drawing Sheets

METHOD FOR FABRICATING METAL OXIDE SEMICONDUCTOR

BACKGROUND OF THE INVENTION

1. Field of the Invention

The invention relates in general to a semiconductor fabricating method, and more particularly to a fabricating method for a teal oxide semiconductor (MOS).

2. Description of the Related Art

As integrated circuits become more complicated and their function becomes more powerful, the required density of transistors in an integrated circuit increases correspondingly. The high density of these complex integrated circuits cannot be easily achieved by simply decreasing a layout according to device proportions of the integrated circuits. The device size must be decreased by a design rule and with consideration for possible change in the physical characteristics of the device. For example, channel length of a MOS transistor cannot be reduced infinitely. Reduction size may cause a short channel effect. Once the short channel effect happens, a punchthrough problem is likely to occur. The punchthrough problem occurs due to current leakage when the MOS transistor is switched off. The conventional solution to the punchthrough problem is to increase punchthrough voltage, in a procedure such as a punchthrough stopper implantation or a halo implantation.

FIG. 1 and FIG. 2 respectively explain the related positions of an anti-punchthrough region and a MOS formed by conventional methods.

In FIG. 1, an N-type MOS is taken as an example. In a typical punchthrough stopper implantation, P-type impurities are implanted in the substrate 100 before forming a gate 106 and a source/drain region 120. A heavily doped anti-punchthrough region 114 is formed in the substrate 100 below the surface-channel region 112 between the source/drain region 120.

In FIG. 2, a tilt-angle halo implantation step is performed after a gate 206 and a source/drain extension 210a are formed. P-type impurities are locally implanted in the substrate 200. An anti-punchthrough region 214, which is connected to the source/drain extension 210a, is formed in the substrate 200. In contrast with the anti-punchthrough region 114 formed by punchthrough stopper implantation, the anti-punchthrough region 214 formed by halo-implantation, which region connects to the extension region 210a, has higher anti-punchthrough ability. Hence, the anti-punchthrough region 214 is more suitable than the anti-punchthrough region 114 for a MOS occupying a small planar area.

A depletion region usually exists at an interface of the interchangeable source/drain region and the substrate due to, for example, a depletion of electron holes for a P-type substrate. This depletion region behaves like a capacitor and contributes a junction capacitance. The junction capacitance is larger if the depletion region is larger. The depletion region is larger if the dopant density is larger or junction contact area is larger. A higher dopant density also needs a higher dopant density in the anti-punchthrough region formed by halo-implantation in order to reduce a short channel effect. However, another depletion region also exists at an interface between the anti-punchthrough region formed by halo-implantation and the source/drain region. Since the anti-punchthrough region carries higher dopant density, it results in a higher junction capacitance. It is natural for an AC circuit that the junction capacitance can reduce an alternative-current (AC) operation speed. In addition, the gate oxide layer also induces an oxide capacitor, which is coupled with the junction capacitor in series. The oxide capacitor increases the junction capacitance and causes a slower AC operation speed.

SUMMARY OF THE INVENTION

It is therefore an object of the invention to provide an improved method for forming a halo doped region by self-alignment. The improved method includes a formation of the halo doped region below a source/drain extension and between a source/drain region so as to control a short channel effect.

It is another objective of the present invention to provide an improved method for forming a MOS transistor. The improved method includes a formation of an offset spacer on the sidewall of the gate of the MOS transistor so as to reduce a lateral extension length of the source/drain extension. The overlap region between the gate and the source/drain extension is therefore reduced so that a less overlapping capacitance can be obtained. An AC operation speed is further increased.

It is still another objective of the present invention to provide a method for forming a MOS transistor. The MOS transistor comprises an air gap between the gate and an insulating spacer beside the gate. Since the dielectric constant of the air gap is very low, a parasitic capacitance formed between the gate and other conductor adjoining the insulating spacer is decreased.

It is still another objective of the present invention to provide an improved method for forming a MOS transistor. A halo doped region, which has a smaller area than a convention halo doped region, is formed below the source/drain extension so as to reduce the junction capacitance. Thus a margin of the junction can be more easily controlled The invention achieves the above-identified objects by providing a method of fabrication for a MOS transistor. A substrate with an isolation structure thereon is provided. A gate oxide layer is formed on the substrate. A polysilicon layer is formed on the gate oxide layer. The polysilicon layer is patterned to form a gate on the gate oxide layer. An offset spacer is formed on the sidewall of the gate. A source/drain extension is formed in the substrate on two sides of the gate by ion implantation. An insulating spacer is formed on the sidewall of the offset spacer. A source/drain region is formed in the substrate by ion implantation using the gate, the offset spacer and the insulating spacer as a mask. Salicide is formed on the gate and on the surface of the source/drain region. After forming the salicide, the offset spacer is removed. After removing the offset spacer, a halo doped region is formed in the substrate below the source/drain extension by ion implantation.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
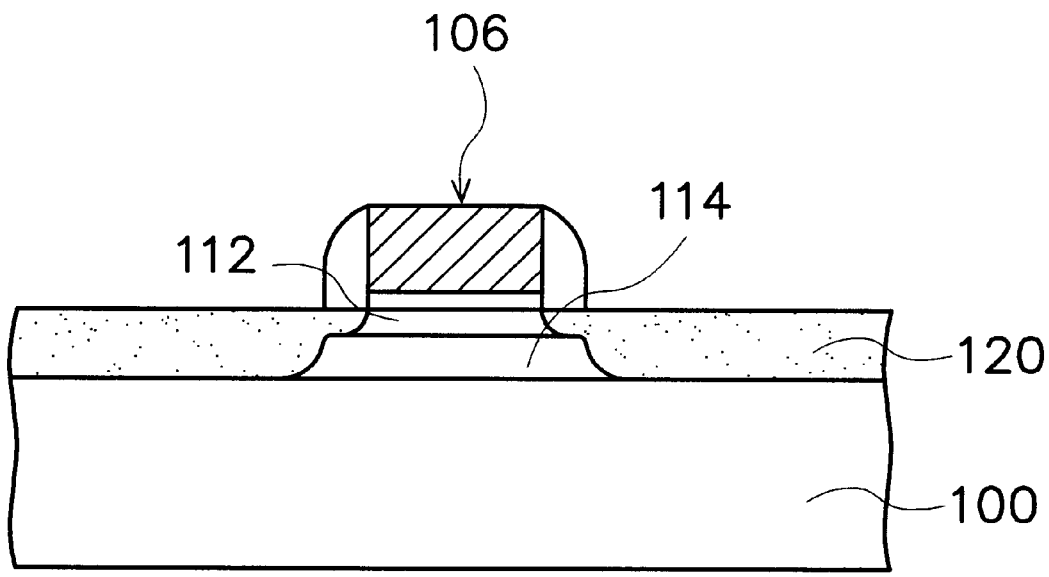
FIG. 1 is a schematic, cross-sectional view showing related positions of a conventional metal oxide semiconductor and an anti-punchthrough region.
Figure 2:
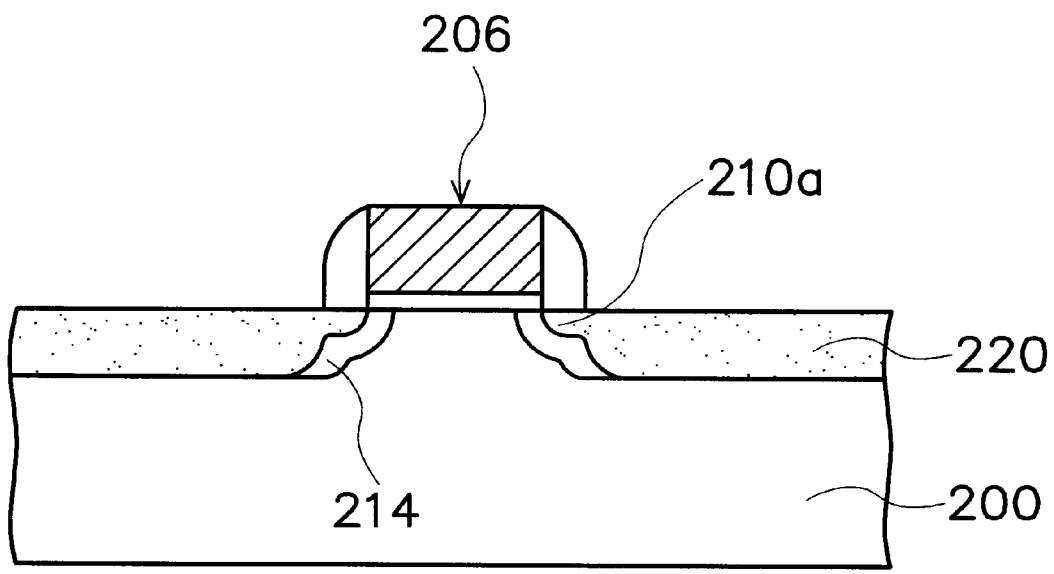
FIG. 2 is a schematic, cross-sectional view showing related positions of a conventional metal oxide semiconductor and another anti-punchthrough region.

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3F are schematic, cross-sectional views showing a fabricating method of a metal oxide semiconductor according to one preferred embodiment of the invention.

Figure 3A:
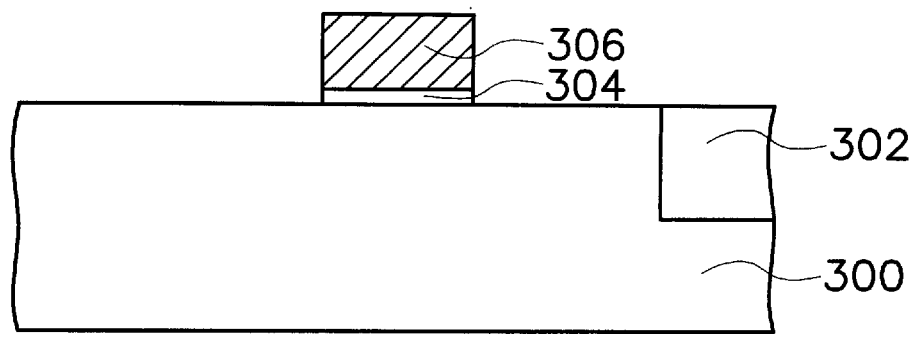
FIGS. 3A–3F are schematic, cross-sectional views showing a fabricating method of a metal oxide semiconductor according to one preferred embodiment of the invention.

In FIG. 3A, a gate oxide layer 304 is formed on a provided substrate 300. The substrate 300 has an isolation structure 302, such as shallow trench isolation, formed thereon. A conductive layer is patterned to form a gate 306 of a MOS transistor by photolithography and etching processes. The substrate 300 can be a P-type silicon substrate, an N-type silicon substrate, a P-well, or an N-well, for example. Typically, an oxide layer (not shown) having a preferred thickness of about 40 Å to 200 Å is formed on the substrate 300. A conductive layer (not shown) is formed on the oxide layer. The conductive layer can be a polysilicon layer formed by chemical vapor deposition, for example. The preferred thickness of the conductive layer is about 1500 Å to 2000 Å, for example. For example, conventional photolithographic and etching processes are performed to pattern the conductive layer and the oxide layer, which forms the gate oxide layer 304 and the gate 306 as shown in figure.

Figure 3B:
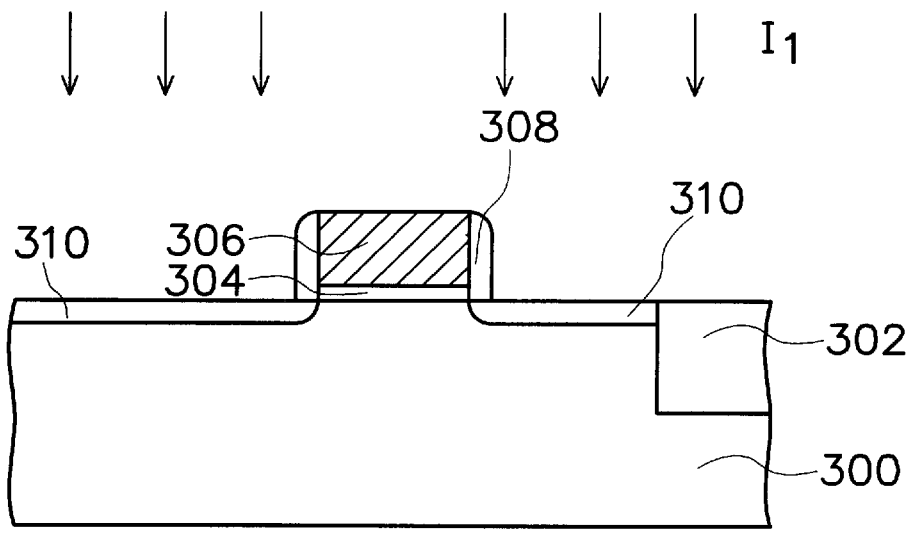

In FIG. 3B, an offset spacer 308 with a thickness of about 300 Å is formed on the sidewall of the gate 306. The material of the offset spacer 308 includes silicon nitride or silicon-oxy-nitride. The offset spacer 308 can be formed by a method described above. A silicon nitride layer or a silicon-oxy-nitride layer (not shown) is formed over the substrate 300 by chemical vapor deposition. An etching back step is performed. The silicon nitride layer or the silicon-oxy-nitride layer is removed to form the offset spacer 308 on the sidewall of the gate 306.

A source/drain extension 310 is formed in the substrate 300 beside the gate 306. Typically, the gate 306 and the offset spacer 308 are used as a mask while an ion implantation step $I_1$ is performed. Ion impurities are implanted in the substrate 300 in the ion implantation step $I_1$. When forming a NMOS, the impurities, such P ions, As ions, or other suitable N-type impurities, are implanted to form an N-type source/drain extension. When forming a PMOS, the impurities, such as B ions $BF_2^+$ ions, or other suitable P-type impurities, are implanted to form a P-type source/drain extension.

The ion implantation step $I_1$ is performed using the gate and the offset spacer as a mask so that overlap of the source/drain extension 310 and the gate 306 is smaller than a conventional source/drain extension. A parasitic capacitance between the gate 306 and the source/drain extension 310 is thus reduced.

Figure 3C:
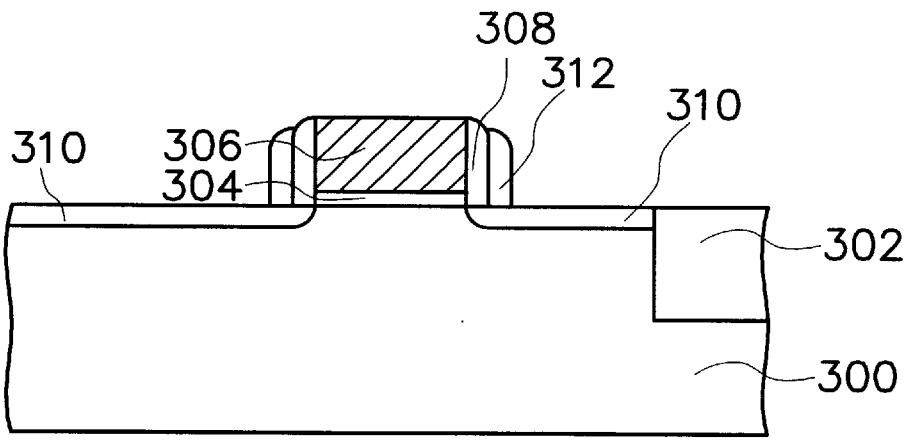

In FIG. 3C, an insulating spacer 312 is formed on the sidewall of the offset spacer 308. It is noted that the etching selectivity of the offset spacer 308—the insulating spacer 312 must be high. The material of the insulating spacer 312 includes silicon oxide. The insulating spacer 312 can be formed by a method as described above. An insulating layer (not shown) is formed over the substrate 300 by chemical vapor deposition. An etching back step is performed. The insulating layer is removed to form the offset spacer 308 on the sidewall of the gate 306.

Figure 3D:
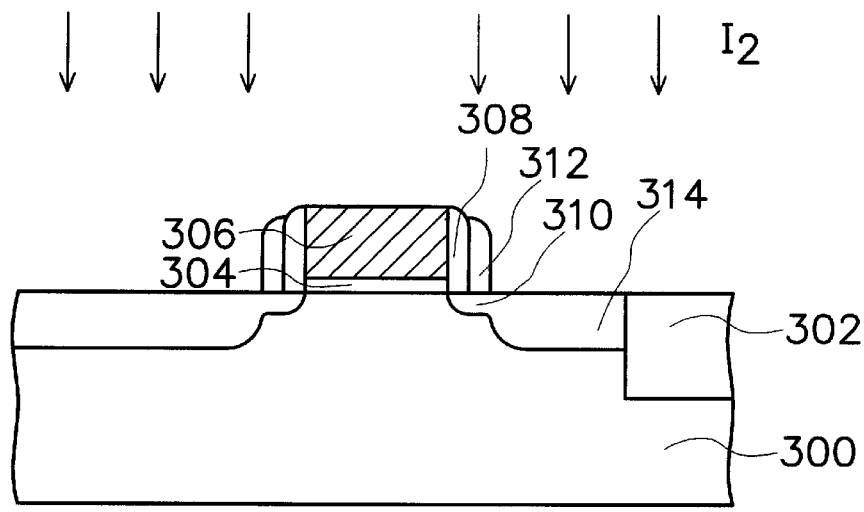

In FIG. 3D, an ion implantation step $I_2$ is performed using the gate 306, the offset spacer 308 and the insulating spacer 312 as masks to form a source/drain region 314 in the substrate 300 beside the insulating spacer 312. The source/drain region 314 includes a portion of the source/drain extension 310. The source/drain region 314 is to the side of the source/drain extension 310, which is below the insulating spacer 312 in the substrate 300. When forming a NMOS, the impurities, such as P ions, As ions, or other suitable N-type impurities, are implanted in the ion implantation step $I_2$ to from an N-type source/drain region. When forming a PMOS, the impurities, such as B ions, $BF_2^+$ ions, or other suitable P-type impurities, are implanted in the ion implantation step $I_2$ to form a P-type source/drain region. It is known that the source/drain extension 310 and the source/drain region 314 are N-type in the NMOS. The source/drain extension 310 and the source/drain region 314 are P-type in a PMOS.

Figure 3E:
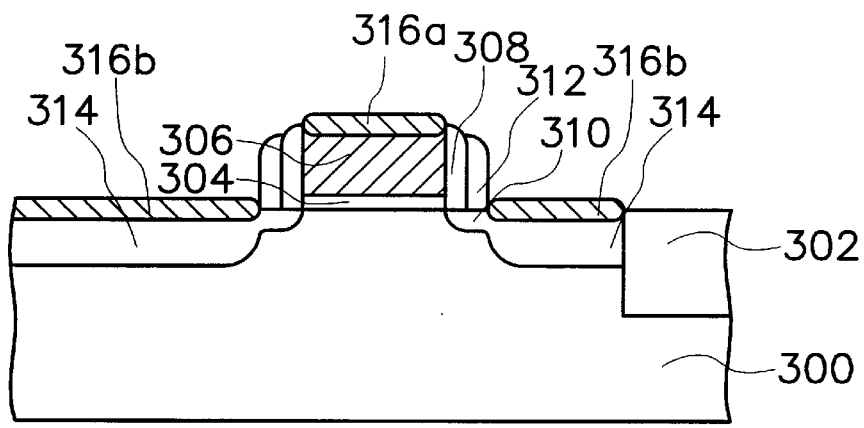

In FIG. 3E, polysilicide 316a, 316b are respectively formed on the gate 306 and on the substrate 300 positioned on the source/drain region 314. The polysilicide 316a, 316b are formed by the steps described above. A metal layer (not shown) is formed over the structure shown in FIG. 3D. When a thermal process is performed, a part of the metal layer contacting the gate 306 and the source/drain region 314 reacts to form the polysilicide 316a, 316b. The remaining metal layer is removed.

Figure 3F:
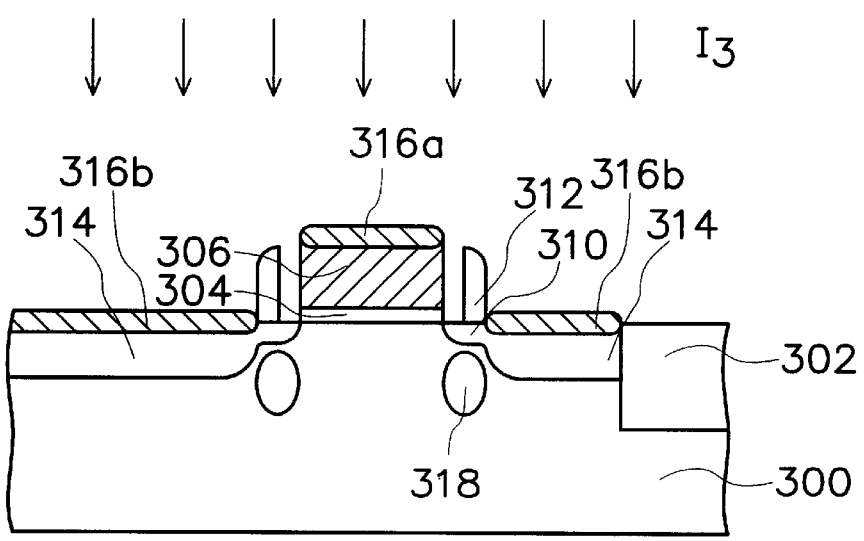

In FIG. 3F, the offset spacer 308 is removed, for example, by phosphoric acid to form a air gap between the gate 306 and the insulating layer 312. It is noted that the offset spacer 308 and the insulating spacer 312 must have a high etching selectivity. An ion implantation step $I_3$ is performed using the gate 306 and the insulating layer 312 as masks to form a halo doped region 318 in the substrate 300 to the side of the source/drain region 314 below the source/drain extension 310. The halo doped region 318 is formed in order to decrease the occurrence of the short channel effect. When forming an NMOS, the impurities, such as B ions, $BF_2^+$ ions, or other suitable P-type impurities, are implanted to form a P-type, halo-implanted region. When forming a PMOS, the impurities, such as P ions, As ions, or other suitable N-type impurities, are implanted to form an N-type, halo-implanted region.

Since the air gap is between the gate 306 and the insulating spacer 312, the halo dope region 318 is formed self-aligned in the substrate 300 under the air gap. The short channel effect is thus controlled. The self-aligned halo doped region 318 is smaller than a conventional halo doped region so that junction capacitance between the halo doped region 318 and the source/drain region is thus reduced.

Moreover, the insulating spacer 312 and the air gap are between the gate an another conductor, which is formed in following steps. The gate 306, the conductor and the spacer compose a similar transistor structure. The dielectric constant of the air gap is about 1 and is lower than other dielectric materials. The parasitic capacitance from the similar transistor structure is thus reduced.

A feature of the invention is that the source/drain extension is formed in the substrate after forming the offset spacer beside the gate. The overlap between the gate and the source/drain extension is reduced so that the parasitic capacitance decreased.

Another feature of the invention is that the halo doped region is formed by self-alignment. The position of the halo doped region is controlled accurately to prevent effectively the short channel effect.

Yet another feature of the invention is that the halo dope region is small than a conventional halo doped region. Junction between the halo doped region and the source/drain region or junction between the halo doped region and the source/drain extension is reduced to decrease the junction capacitance.

Another feature of the invention is that an air gap, which has a small dielectric constant, is formed between the insulating spacer and the gate to reduce the parasitic capacitance between the gate and the fringe conductor.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method forming a metal oxide semiconductor transistor, the method comprising:

providing a substrate;

forming a gate oxide layer on the substrate;

forming a gate on the gate oxide layer;

forming an offset spacer on the sidewall of the gate;

performing a first ion implantation step to form a source/drain extension in the substrate after the offset spacer is formed;

forming an insulating spacer on the sidewall of the offset spacer;

performing a second ion implantation step to form a source/drain region in the substrate, wherein the source/drain region comprises a part of the source/drain extension;

forming salicide on the gate and on the source/drain region;

removing the offset spacer; and performing a third ion implantation step to form a halo doped region in the substrate beside the source/drain region.

2. The method according to claim 1, wherein a material of the offset spacer is selected from a group comprising silicon nitride and silicon-oxy-nitride.

3. The method according to claim 1, wherein a thickness of the offset spacer is about 300 Å.

4. The method according to claim 1, wherein the substrate and the halo doped region have a first conductive type, and the source/drain extension and the source/drain region have a second conductive type.

5. The method according to claim 1, wherein the step of removing the offset spacer is performed using phosphoric acid.

6. The method according to claim 1, wherein a material of the insulating spacer comprises silicon oxide.

7. A method for forming a metal oxide semiconductor transistor, which method is performed on a substrate comprising a gate thereon, comprising the steps of:

forming an offset spacer on the sidewall of the gate;

forming an source/drain extension around the offset spacer after which is formed;

forming an insulating spacer on the sidewall of the offset spacer;

forming a source/drain region in the substrate, wherein the source/drain region comprises a part of the source/drain extension;

removing the offset spacer; and forming a halo doped region in the substrate beside the source/drain region.

8. The method according to claim 7, wherein a material of the offset spacer is selected from a group comprising silicon nitride and silicon-oxy-nitride.

9. The method according to claim 7, wherein a thickness of the offset spacer is about 300 Å.

10. The method according to claim 7, wherein the substrate and the halo doped region have a first conductive type, and the source/drain extension and the source/drain region have a second conductive type.

11. The method according to claim 7, wherein the step of removing the offset spacer is performed using phosphoric acid.

12. The method according to claim 7, wherein a material of the insulating spacer comprises silicon oxide.

13. A method for forming a halo doped region, which method is performed on a substrate comprising at least a gate thereon, comprising the steps of:

forming an offset spacer on the sidewall of the gate;

forming a source/drain extension in the substrate around the offset spacer after the offset spacer is formed;

forming an insulating spacer on the sidewall of the offset spacer;

forming a source/drain region in the substrate wherein the source/drain region comprises a part of the source/drain extension;

forming a salicide layer on the gate and the source/drain region;

removing the offset spacer; and forming a halo doped region in the substrate beside source/drain region.

14. The method according to claim 13, wherein a material of the offset spacer is selected from a group comprising silicon nitride and silicon-oxy-nitride.

15. The method according to claim 13, wherein a thickness of the offset spacer is about 300 Å.

16. The method according to claim 13, wherein the substrate and the halo doped region have a first conductive type, and the source/drain extension and the source/drain region have a second conductive type.

17. The method according to claim 13, wherein the step of removing the offset spacer is performed using phosphoric acid.

18. The method according to claim 13, wherein a material of the insulating spacer comprises silicon oxide.

* * * * *